(12) United States Patent
Rosenfeld et al.

(10) Patent No.: US 7,124,809 B2
(45) Date of Patent: *Oct. 24, 2006

(54) BRAZED WICK FOR A HEAT TRANSFER DEVICE

(75) Inventors: John H. Rosenfeld, Lancaster, PA (US); Kenneth G. Minnerly, Lititz, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/099,758

(22) Filed: Apr. 6, 2005

(65) Prior Publication Data

US 2005/0189091 A1 Sep. 1, 2005

Related U.S. Application Data

(63) Continuation of application No. 10/607,337, filed on Jun. 26, 2003, now Pat. No. 6,994,152.

(51) Int. Cl.
*F28D 15/04* (2006.01)
*H05K 7/20* (2006.01)

(52) U.S. Cl. ............ 165/104.26; 165/104.21; 165/133

(58) Field of Classification Search ........... 165/104.21, 165/104.26, 185, 80.3, 104.33, 133, 907; 361/700; 257/715; 29/890.032; 419/2, 419/6; 174/15.2
See application file for complete search history.

(56) References Cited

U.S. PATENT DOCUMENTS

| | | | |
|---|---|---|---|
| 3,073,270 A | * | 1/1963 | Johnson et al. ............ 148/24 |
| 3,537,514 A | | 11/1970 | Levendahl |
| 3,613,778 A | | 10/1971 | Feldman, Jr. |
| 3,675,711 A | | 7/1972 | Bilinski et al. |
| 3,681,843 A | | 8/1972 | Arcella et al. |
| 3,762,011 A | | 10/1973 | Staudhammer et al. |
| 3,788,388 A | | 1/1974 | Barkmann |
| 3,821,018 A | | 6/1974 | Campbell |
| 3,828,849 A | | 8/1974 | Corman et al. |
| 4,042,316 A | | 8/1977 | Rabe |
| 4,046,190 A | | 9/1977 | Marcus et al. |
| 4,058,299 A | | 11/1977 | Lindkvist |
| 4,101,691 A | | 7/1978 | Borchert |
| 4,109,709 A | | 8/1978 | Honda |
| 4,116,266 A | | 9/1978 | Sawata |
| 4,118,756 A | | 10/1978 | Nelson et al. |

(Continued)

FOREIGN PATENT DOCUMENTS

EP 112782 A 7/1984

(Continued)

OTHER PUBLICATIONS

Rosenfeld, J.H., "Nucleate Boiling Heat Transfer in Porous Wick Structures," ASME HTD vol. 108, *Heat Transfer Fundamentals, Design, Applications, and Operating Problems*, R.H. Shah, Ed., pp. 47-55, 1989.

(Continued)

*Primary Examiner*—Tho Duong
(74) *Attorney, Agent, or Firm*—Duane Morris LLP

(57) ABSTRACT

A capillary structure for a heat transfer device, such as a heat pipe is provided having a plurality of particles joined together by a brazing compound such that fillets of the brazing compound are formed between adjacent ones of the plurality of particles. In this way, a network of capillary passageways are formed between the particles to aid in the transfer of working fluid by capillary action, while the plurality of fillets, provide enhanced thermal transfer properties between the plurality of particles so as to greatly improve over all heat transfer efficiency of the device.

8 Claims, 9 Drawing Sheets

U.S. PATENT DOCUMENTS

| | | | |
|---|---|---|---|
| 4,177,646 A | 12/1979 | Guadagnin et al. |
| 4,186,796 A | 2/1980 | Usui |
| 4,231,423 A | 11/1980 | Haslett |
| 4,274,479 A | 6/1981 | Eastman |
| 4,279,479 A | 7/1981 | Schrier |
| 4,327,752 A | 5/1982 | Hickel |
| 4,354,482 A | 10/1982 | Beisecker |
| 4,361,133 A | 11/1982 | Bonnema |
| 4,365,851 A | 12/1982 | Andres et al. |
| 4,366,526 A | 12/1982 | Lijoi et al. |
| 4,374,528 A | 2/1983 | Tittert |
| 4,382,448 A | 5/1983 | Tittert |
| 4,489,777 A | 12/1984 | Del Bagno et al. |
| 4,503,483 A | 3/1985 | Basiulis |
| 4,557,413 A | 12/1985 | Lewis et al. |
| 4,616,699 A | 10/1986 | Grote |
| 4,641,404 A | 2/1987 | Seydel et al. |
| 4,697,205 A | 9/1987 | Eastman |
| 4,748,314 A | 5/1988 | Desage |
| 4,765,396 A | 8/1988 | Seidenberg |
| 4,777,561 A | 10/1988 | Murphy et al. |
| 4,807,697 A | 2/1989 | Gernert et al. |
| 4,819,719 A | 4/1989 | Grote et al. |
| 4,830,097 A | 5/1989 | Tanzer |
| 4,840,224 A | 6/1989 | Dietzsch |
| 4,865,729 A | 9/1989 | Saxena et al. |
| 4,880,052 A | 11/1989 | Meyer, IV et al. |
| 4,883,116 A | 11/1989 | Seidenberg et al. |
| 4,885,129 A | 12/1989 | Leonard et al. |
| 4,912,548 A | 3/1990 | Shanker et al. |
| 4,921,041 A | 5/1990 | Akachi |
| 4,929,414 A | 5/1990 | Leonard et al. |
| 4,931,905 A | 6/1990 | Cirrito et al. |
| 4,960,202 A | 10/1990 | Rice et al. |
| 4,982,274 A | 1/1991 | Murase et al. |
| 5,059,496 A | 10/1991 | Sindorf |
| 5,076,352 A | 12/1991 | Rosenfeld et al. |
| 5,101,560 A | 4/1992 | Leonard et al. |
| 5,103,897 A | 4/1992 | Cullimore et al. |
| 5,148,440 A | 9/1992 | Duncan |
| 5,160,252 A | 11/1992 | Edwards |
| 5,200,248 A | 4/1993 | Thompson et al. |
| 5,219,020 A | 6/1993 | Akachi |
| 5,242,644 A | 9/1993 | Thompson et al. |
| 5,253,702 A | 10/1993 | Davidson et al. |
| 5,268,812 A | 12/1993 | Conte |
| 5,283,715 A | 2/1994 | Carlsten et al. |
| 5,283,729 A | 2/1994 | Lloyd |
| 5,320,866 A | 6/1994 | Leonard |
| 5,331,510 A | 7/1994 | Ouchi et al. |
| 5,333,470 A | 8/1994 | Dinh |
| 5,349,237 A | 9/1994 | Sayka et al. |
| 5,408,128 A | 4/1995 | Furnival |
| 5,409,055 A | 4/1995 | Tanaka et al. |
| 5,412,535 A * | 5/1995 | Chao et al. ............... 361/700 |
| 5,522,455 A | 6/1996 | Brown et al. |
| 5,549,394 A | 8/1996 | Nowak et al. |
| 5,632,158 A | 5/1997 | Tajima |
| 5,642,776 A * | 7/1997 | Meyer et al. .......... 165/104.26 |
| 5,664,890 A | 9/1997 | Nowak et al. |
| 5,711,816 A | 1/1998 | Kirlin et al. |
| 5,769,154 A | 6/1998 | Adkins et al. |
| 5,826,645 A | 10/1998 | Meyer, IV et al. |
| 5,847,925 A | 12/1998 | Progl et al. |
| 5,880,524 A | 3/1999 | Xie |
| 5,883,426 A | 3/1999 | Tokuno et al. |
| 5,884,693 A | 3/1999 | Austin |
| 5,890,371 A | 4/1999 | Rajasubramanian |
| 5,947,193 A | 9/1999 | Adkins et al. |
| 5,950,710 A | 9/1999 | Liu |
| 6,041,211 A | 3/2000 | Hobson et al. |
| 6,055,157 A | 4/2000 | Bartilson |
| 6,055,297 A | 4/2000 | Terry |
| 6,056,044 A | 5/2000 | Benson et al. |
| 6,076,595 A | 6/2000 | Austin |
| 6,082,443 A | 7/2000 | Yamamoto et al. |
| 6,148,906 A | 11/2000 | Li et al. |
| 6,154,364 A | 11/2000 | Girrens et al. |
| 6,158,502 A | 12/2000 | Thomas |
| 6,167,948 B1 | 1/2001 | Thomas |
| 6,169,852 B1 | 1/2001 | Liao et al. |
| 6,227,287 B1 | 5/2001 | Tanaka |
| 6,230,407 B1 | 5/2001 | Akutsu |
| 6,239,350 B1 | 5/2001 | Sievers et al. |
| 6,256,201 B1 | 7/2001 | Ikeda et al. |
| 6,293,333 B1 | 9/2001 | Ponnappan et al. |
| 6,302,192 B1 | 10/2001 | Dussinger et al. |
| 6,303,081 B1 | 10/2001 | Mink et al. |
| 6,382,309 B1 | 5/2002 | Kroliczek et al. |
| 6,388,882 B1 | 5/2002 | Hoover et al. |
| 6,397,935 B1 | 6/2002 | Yamamoto et al. |
| 6,418,017 B1 | 7/2002 | Patel et al. |
| 6,738,257 B1 * | 5/2004 | Lai ........................... 361/700 |
| 6,880,626 B1 * | 4/2005 | Lindemuth et al. .... 165/104.26 |
| 6,938,680 B1 * | 9/2005 | Garner et al. .......... 165/104.26 |
| 6,994,152 B1 * | 2/2006 | Rosenfeld et al. ..... 165/104.21 |
| 6,997,245 B1 * | 2/2006 | Lindemuth et al. .... 165/104.26 |
| 7,028,759 B1 * | 4/2006 | Rosenfeld et al. ..... 165/104.26 |
| 2004/0211549 A1 | 10/2004 | Garner et al. |
| 2004/0243133 A1 * | 12/2004 | Materna ..................... 606/76 |

FOREIGN PATENT DOCUMENTS

JP 59024538 A 2/1984

OTHER PUBLICATIONS

Rosenfeld, J.H. and J.E. Lindemuth, "Acetone Heat Pipes for Stirling Orbiter Refrigerator/Freezer," Contract G350240J70—final report to GE Gov't. Service, Apr. 16, 1993.

McDonald, K.E., Berchowitz, D., Rosenfeld, J.H. and Lindemuth, J.E., "Stirling Refrigerator for Space Shuttle Experiements," Proc. 29th IECEC, paper 94-4179, pp. 1807-1812, 1994.

Lindemuth, J.E., "Stainless Steel/Propylene Heat Pipe Interface for Stirling Orbiter Refrigerator/Freezer," NASA LeRC final report, PO. No. C-76546-F, Apr. 21, 1998.

Rosenfeld, J.H. and Lindemuth, J.E., "Heat Transfer in Sintered Groove Heat Pipes," International Heat Pipe Conference, 1999.

Rosenfeld, J.H. and Noth, M.T., "Porous Media Heat Exchangers for Cooling of High-Power Optical Components," *Optical Engineering*, vol. 34, No. 2, pp. 335-341, Feb. 1995.

Rosenfeld, J.H., Toth, J.E., and Phillips, A.L., "Emerging Applications for Porous Media Heat Exchangers," Proc. Int. Conf. on Porous Media and Their Applications in Science, Eng., and Industry, Kona, HI, Jun. 16-21, 1996.

* cited by examiner

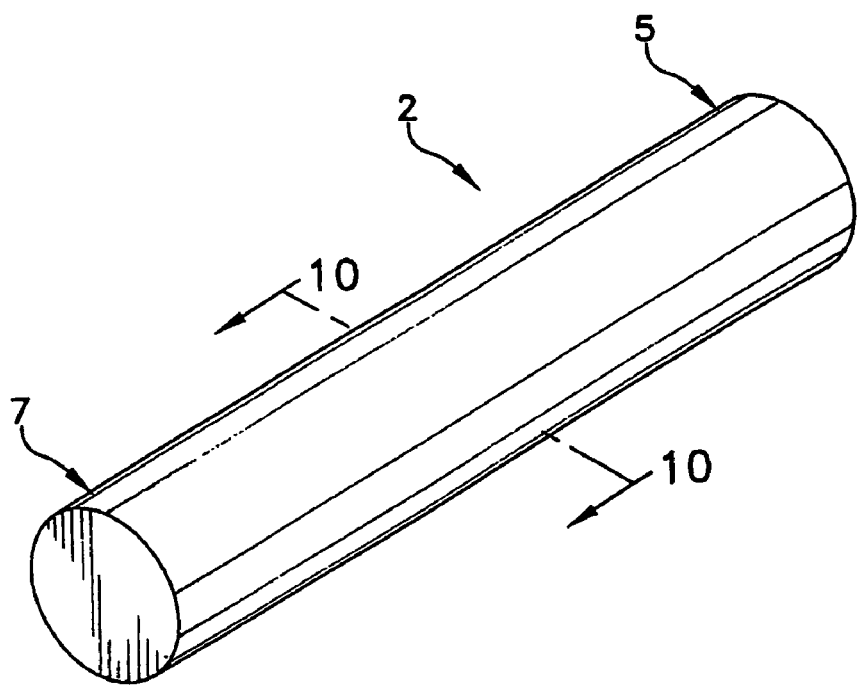
FIG. 9
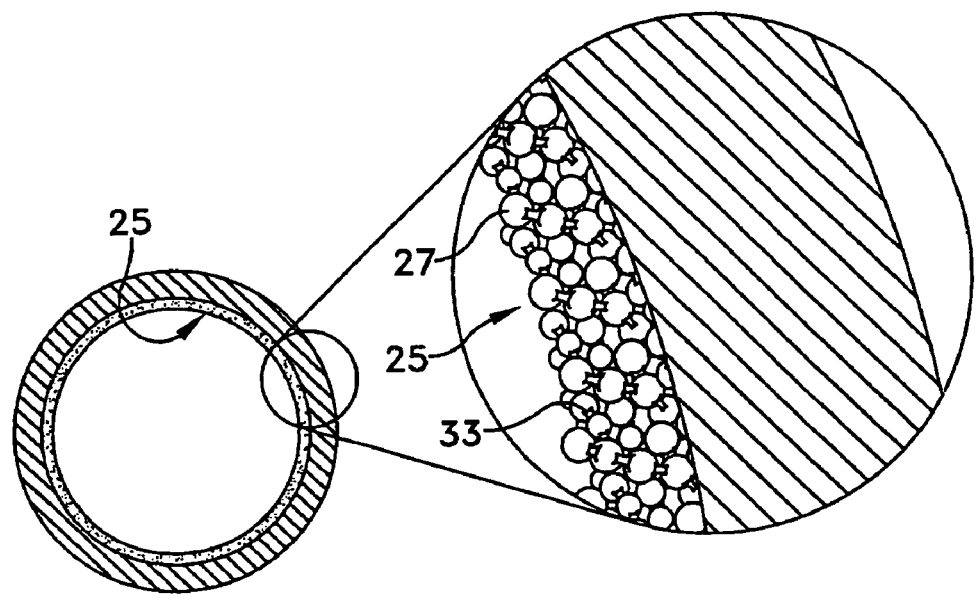
FIG. 10
FIG. 11

BRAZED WICK FOR A HEAT TRANSFER DEVICE

This application is a continuation application of U.S. application Ser. No. 10/607,337, and filed on Jun. 26, 2003 now U.S. Pat. No. 6,994,152.

FIELD OF THE INVENTION

The present invention generally relates to heat transfer devices that rely upon capillary action as a transport mechanism and, more particularly, to wicking materials for such devices.

BACKGROUND OF THE INVENTION

It has been suggested that a computer is a thermodynamic engine that sucks entropy out of data, turns that entropy into heat, and dumps the heat into the environment. The ability of prior art thermal management technology to get that waste heat out of semiconductor circuits and into the environment, at a reasonable cost, limits the density and clock speed of electronic systems.

A typical characteristic of heat transfer devices for electronic systems is that the atmosphere is the final heat sink of choice. Air cooling gives manufacturers access to the broadest market of applications. Another typical characteristic of heat transfer devices for electronics today is that the semiconductor chip thermally contacts a passive spreader or active thermal transport device, which conducts the heat from the chip to one of several types of fins. These fins convect heat to the atmosphere with natural or forced convection.

As the power to be dissipated from semiconductor devices increases with time, a problem arises: over time the thermal conductivity of the available materials becomes too low to conduct the heat from the semiconductor device to the fins with an acceptably low temperature drop. The thermal power density emerging from the semiconductor devices will be so high that copper, silver, or even gold based spreader technology will not be adequate.

One technology that has proven beneficial to this effort is the heat pipe. A heat pipe includes a sealed envelope that defines an internal chamber containing a capillary wick and a working fluid capable of having both a liquid phase and a vapor phase within a desired range of operating temperatures. When one portion of the chamber is exposed to relatively high temperature it functions as an evaporator section. The working fluid is vaporized in the evaporator section causing a slight pressure increase forcing the vapor to a relatively lower temperature section of the chamber, which functions as a condenser section. The vapor is condensed in the condenser section and returns through the capillary wick to the evaporator section by capillary pumping action. Because a heat pipe operates on the principle of phase changes rather than on the principles of conduction or convection, a heat pipe is theoretically capable of transferring heat at a much higher rate than conventional heat transfer systems. Consequently, heat pipes have been utilized to cool various types of high heat-producing apparatus, such as electronic equipment (See, e.g., U.S. Pat. Nos. 3,613,778; 4,046,190; 4,058,299; 4,109,709; 4,116,266; 4,118,756; 4,186,796; 4,231,423; 4,274,479; 4,366,526; 4,503,483; 4,697,205; 4,777,561; 4,880,052; 4,912,548; 4,921,041; 4,931,905; 4,982,274; 5,219,020; 5,253,702; 5,268,812; 5,283,729; 5,331,510; 5,333,470; 5,349,237; 5,409,055; 5,880,524; 5,884,693; 5,890,371; 6,055,297; 6,076,595; and 6,148,906).

The flow of the vapor and the capillary flow of liquid within the system are both produced by pressure gradients that are created by the interaction between naturally-occurring pressure differentials within the heat pipe. These pressure gradients eliminate the need for external pumping of the system liquid. In addition, the existence of liquid and vapor in equilibrium, under vacuum conditions, results in higher thermal efficiencies. In order to increase the efficiency of heat pipes, various wicking structures have been developed in the prior art to promote liquid transfer between the condenser and evaporator sections as well as to enhance the thermal transfer performance between the wick and its surroundings. They have included longitudinally disposed parallel grooves and the random scoring of the internal pipe surface. In addition, the prior art also discloses the use of a wick structure which is fixedly attached to the internal pipe wall. The compositions and geometries of these wicks have included, a uniform fine wire mesh and sintered metals. Sintered metal wicks generally comprise a mixture of metal particles that have been heated to a temperature sufficient to cause fusing or welding of adjacent particles at their respective points of contact. The sintered metal powder then forms a porous structure with capillary characteristics. Although sintered wicks have demonstrated adequate heat transfer characteristics in the prior art, the minute metal-to-metal fused interfaces between particles tend to constrict thermal energy conduction through the wick. This has limited the usefulness of sintered wicks in the art.

Prior art devices, while adequate for their intended purpose, suffer from the common deficiency, in that they do not fully realize the optimum inherent heat transfer potential available from a given heat pipe. To date, no one has devised a wick structure for a heat pipe, which is sufficiently simple to produce, and yet provides optimum heat transfer characteristics for the heat pipe in which it is utilized.

SUMMARY OF THE INVENTION

The present invention provides a capillary structure for a heat transfer device that comprises a plurality of particles joined together by a brazing compound such that fillets of the brazing compound are formed between adjacent ones of the plurality of particles. In this way, a network of capillary passageways are formed between the particles to aid in the transfer of working fluid by capillary action, while the plurality of fillets provide enhanced thermal conduction properties between the plurality of particles so as to greatly improve over all heat transfer efficiency of the device.

In one embodiment, a heat pipe is provided that includes a hermetically sealed and partially evacuated enclosure, where the enclosure has internal surfaces and is at least partially drenched with a two-phase vaporizable fluid. A wick is disposed on at least one of the internal surfaces of the enclosure. The wick advantageously comprises a plurality of particles joined together by a brazing compound such that fillets of the brazing compound are formed between adjacent ones of the plurality of particles so as to form a network of capillary passageways between the particles.

In a further embodiment of the present invention, a heat pipe is provided comprising a sealed and partially evacuated enclosure having an internal surface and a working fluid disposed within a portion of the enclosure. A grooved brazed wick is disposed upon the internal surface of the heat pipe. The grooved brazed wick comprises a plurality of individual particles which together yield an average particle diameter and a brazing compound such that fillets of the brazing compound are formed between adjacent ones of the plurality of particles. At least two lands are provided that are in fluid communication with one another through a particle layer disposed between the at least two lands wherein the particle layer comprises at least one dimension that is no more than about six average particle diameters wherein the particles in the particle layer are thermally engaged with one another by a plurality of the fillets.

A method is also provided for making a heat pipe wick on an inside surface of a heat pipe container comprising the steps of providing a slurry of metal particles that are mixed with a brazing compound. The metal particles have a first melting temperature and the brazing compound has a second melting temperature that is lower than the first melting temperature. At least a portion of the inside surface of the container is coated with the slurry, and dried to form a green wick. The green wick is then heated to a temperature that is no less than the second melting temperature and below the first melting temperature so that the brazing compound is drawn by capillary action toward adjacent ones of the metal particles so as to form heat-distribution fillets between the adjacent metal particles thereby to yield a brazed wick.

In an alternative embodiment of the method of the invention, a mandrel having a grooved contour and a plurality of recesses is positioned within a portion of a heat pipe container. A slurry of metal particles having an average particle diameter and that are mixed with a brazing compound is introduced into the container. The metal particles comprise a first melting temperature and the brazing compound comprises a second melting temperature that is lower than the first melting temperature. At least a portion of the inside surface of the container is coated with the slurry so that the slurry conforms to the grooved contour of the mandrel and forms a layer of slurry between adjacent grooves that comprises no more than about six average particle diameters. The slurry is then dried to form a green wick. The green wick is then heated to a temperature that is no less than the second melting temperature and below the first melting temperature so that the brazing compound is drawn by capillary action toward adjacent ones of the metal particles so as to form heat-distribution fillets between the adjacent metal particles thereby to yield a brazed wick.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein:

FIG. 9 is a further alternative embodiment of heat pipe enclosure formed in accordance with the present invention;

FIG. 10 is a cross-sectional view of the tubular heat pipe enclosure shown in FIG. 9, as taken along lines 10—10 in FIG. 9;

FIG. 11 is a highly enlarged view of a portion of a brazed wick disposed on the wall of the heat pipe shown in FIG. 10;

DETAILED DESCRIPTION OF THE PREFERRED EMBODIMENT

Figure 1:
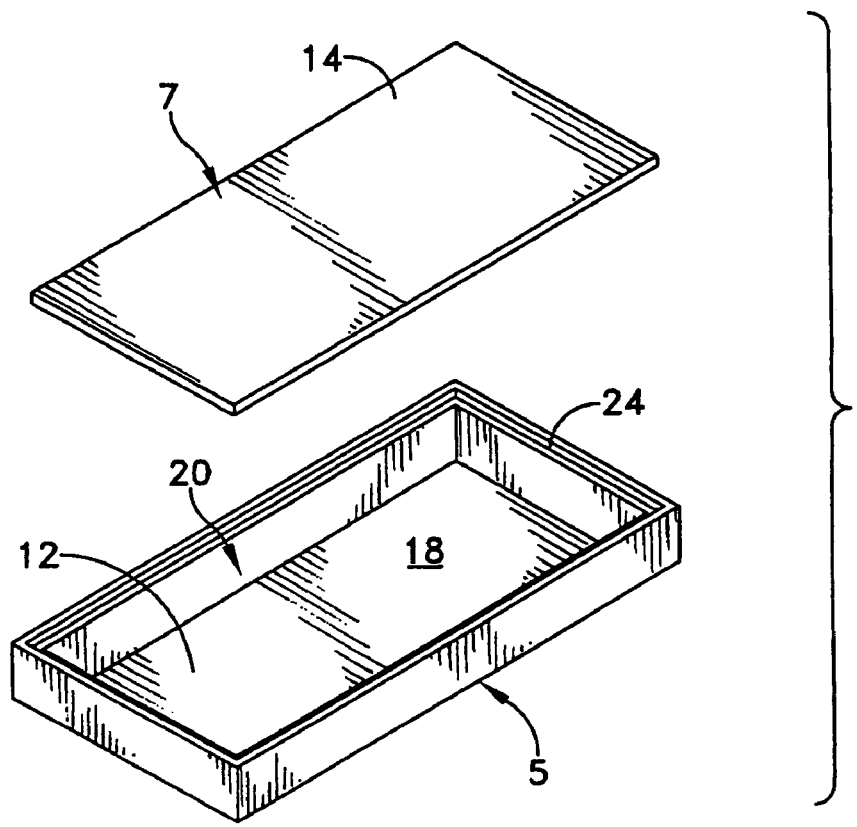
FIG. 1 is an exploded perspective view of a typical heat pipe enclosure of the type used in connection with the present invention.
Figure 2:
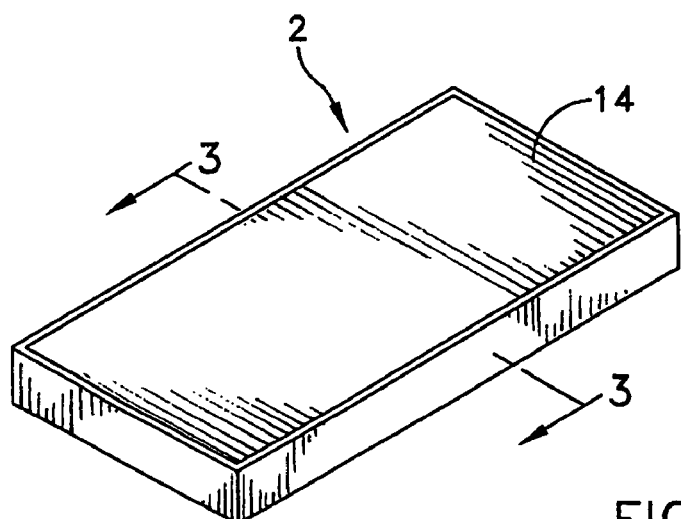
FIG. 2 is a perspective view of the heat pipe enclosure shown in FIG. 1.
Figure 3:
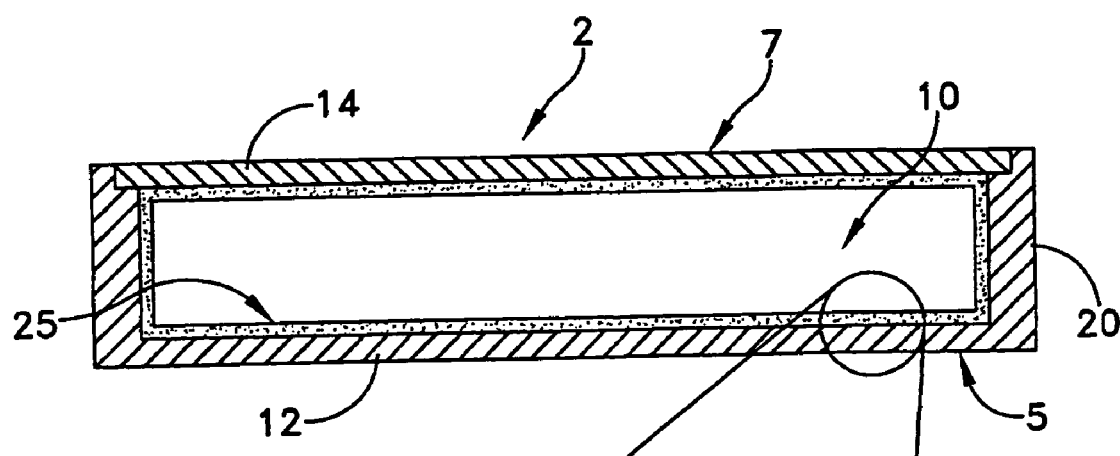
FIG. 3 is a cross-sectional view of the heat pipe shown in FIG. 2.
Figure 4:
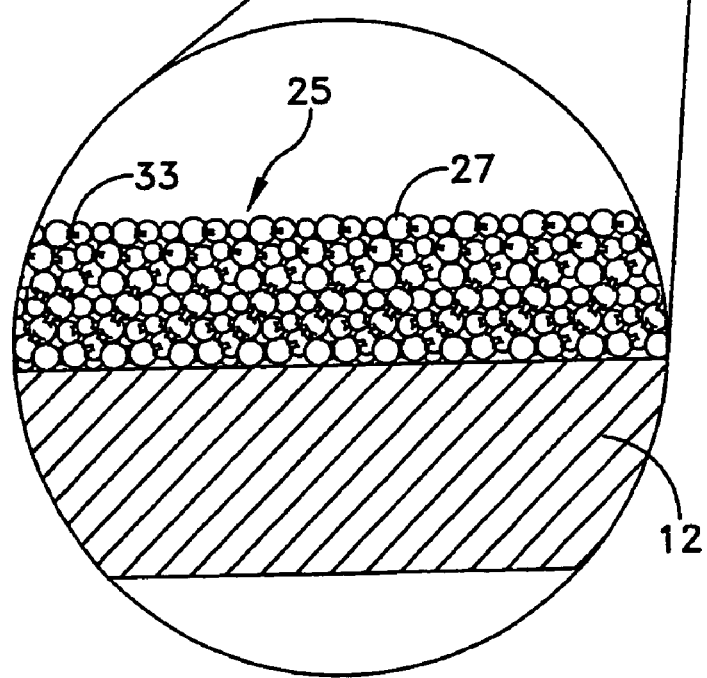
FIG. 4 is a significantly enlarged cross-sectional view of a portion of a brazed wick formed in accordance with one embodiment of the present invention.
Figure 5:
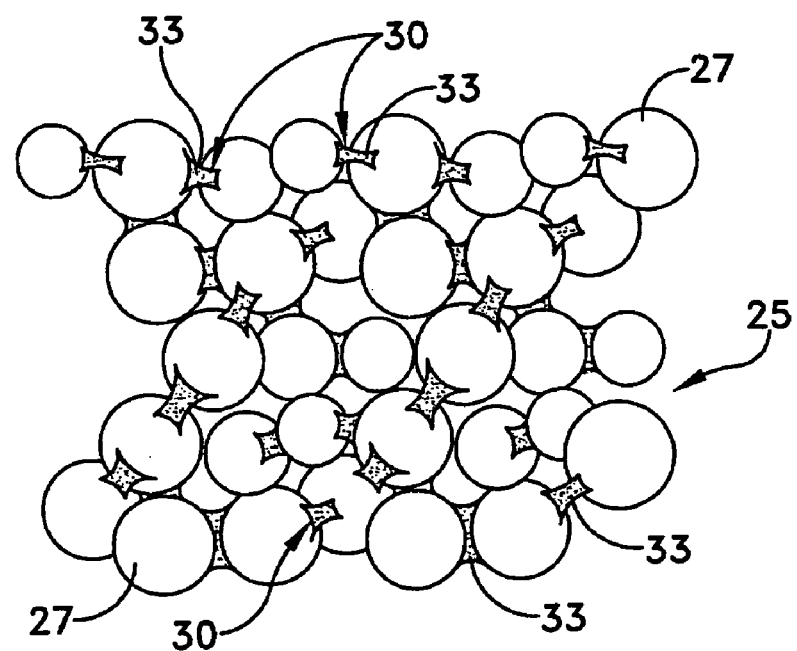
FIG. 5 is a broken-way perspective view that has been highly enlarged to clearly represent metal particles and fillets that comprise one embodiment of the present invention.
Figure 6:
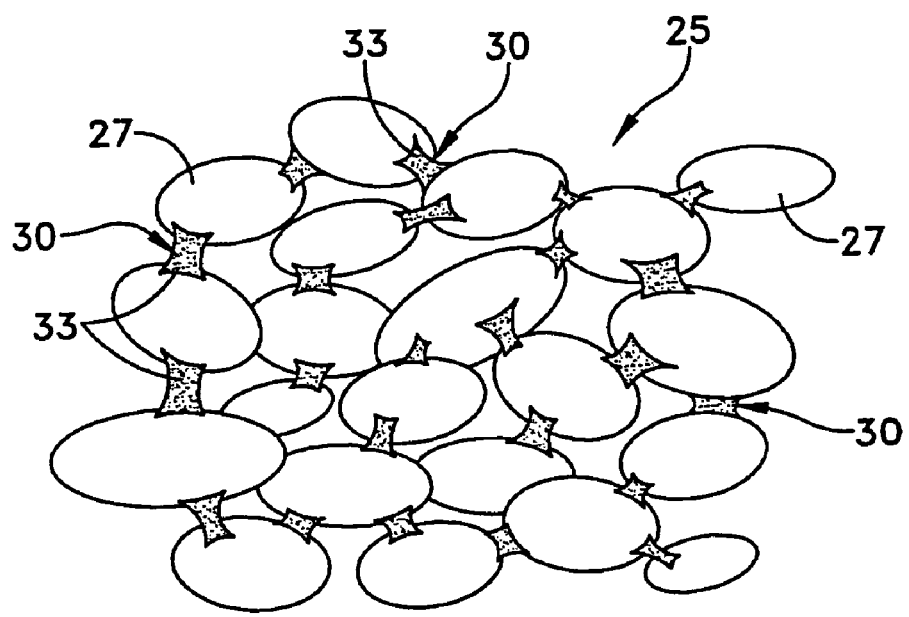
FIG. 6 is a highly enlarged view, similar to FIG. 5, of an alternative embodiment of brazed wick formed in accordance with the present invention.
Figure 7:
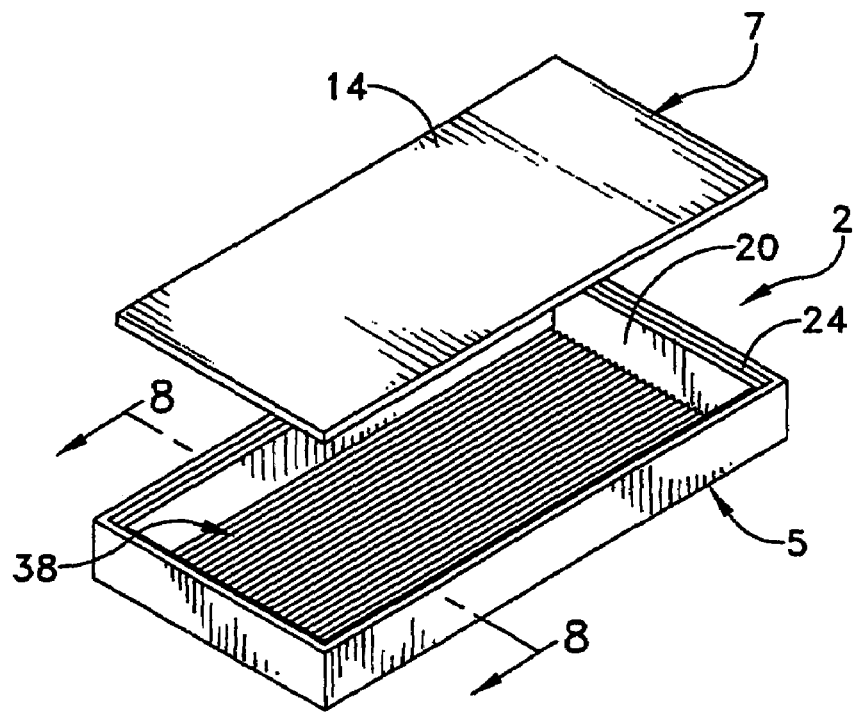
FIG. 7 is an exploded perspective view of a heat pipe enclosure having an alternative embodiment of brazed wick in accordance with the present invention.
Figure 8:
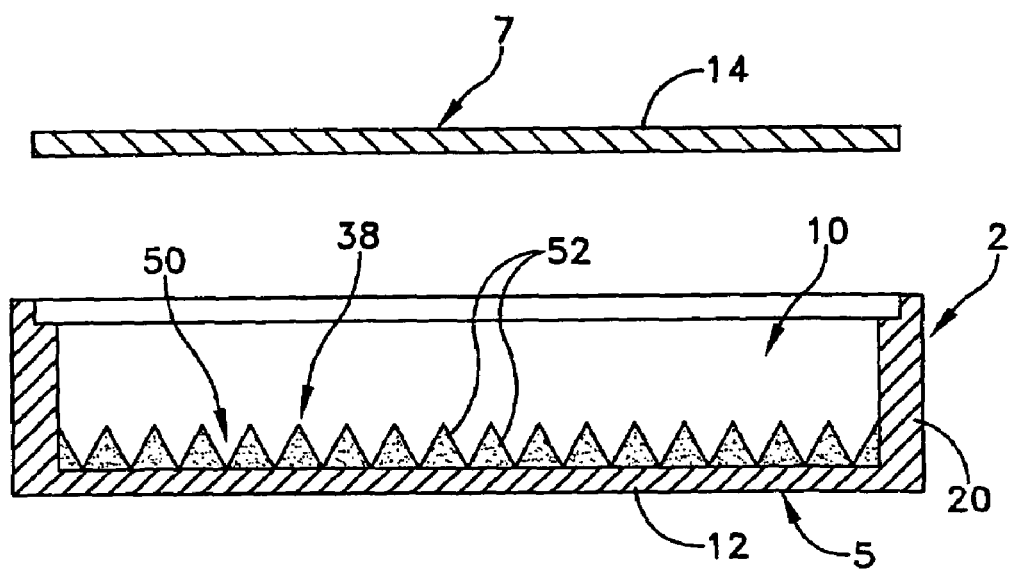
FIG. 8 is a cross-sectional view, as taken along lines 8—8 in FIG. 7.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figures 12, 13:
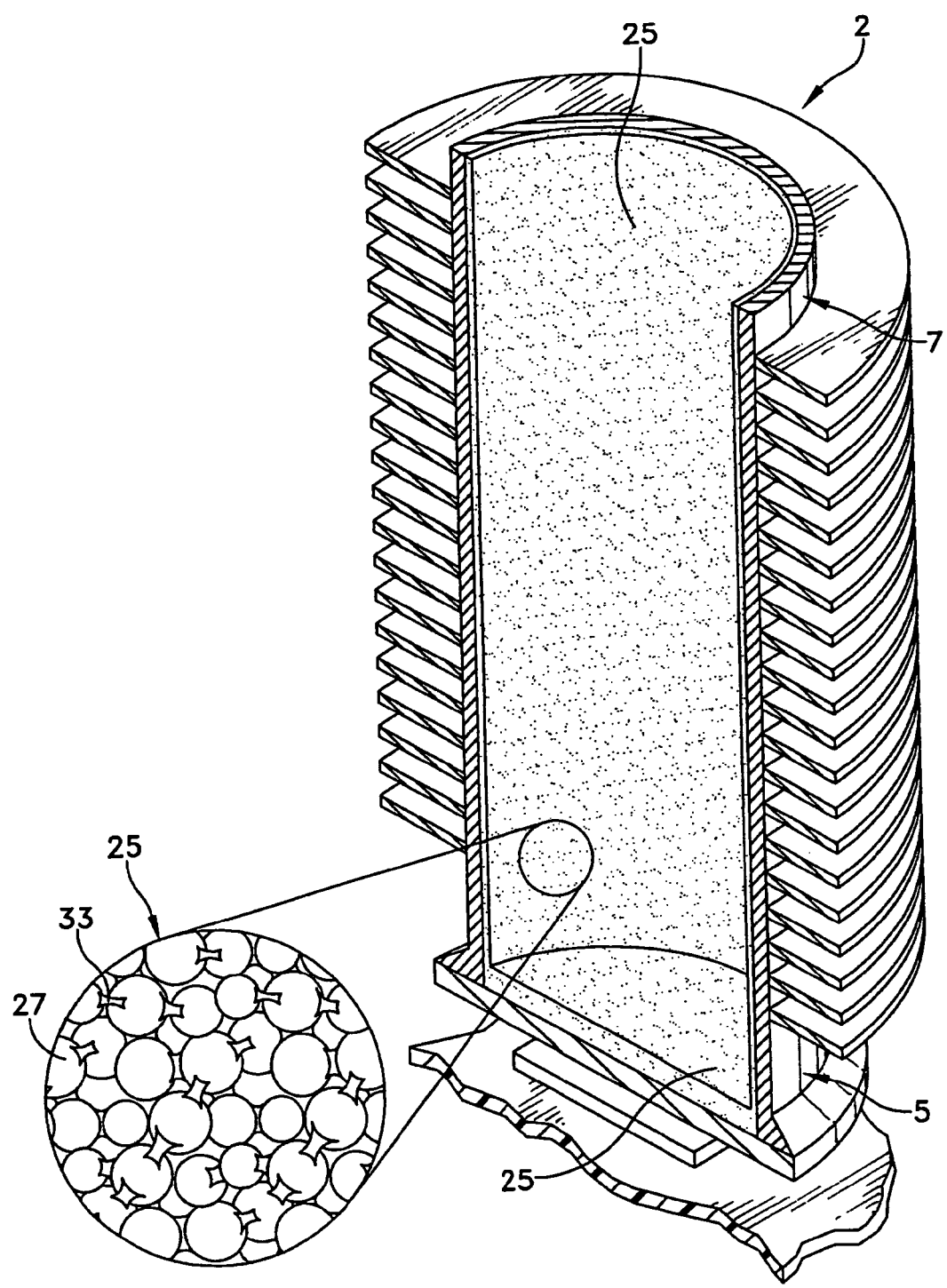
FIG. 12 is a perspective cross-sectional view of a tower heat pipe having a brazed wick formed in accordance with the present invention.
FIG. 13 is a highly enlarged surface view of a brazed wick coating the anterior surfaces of the tower heat pipe shown in FIG. 12.
Figures 14, 15:
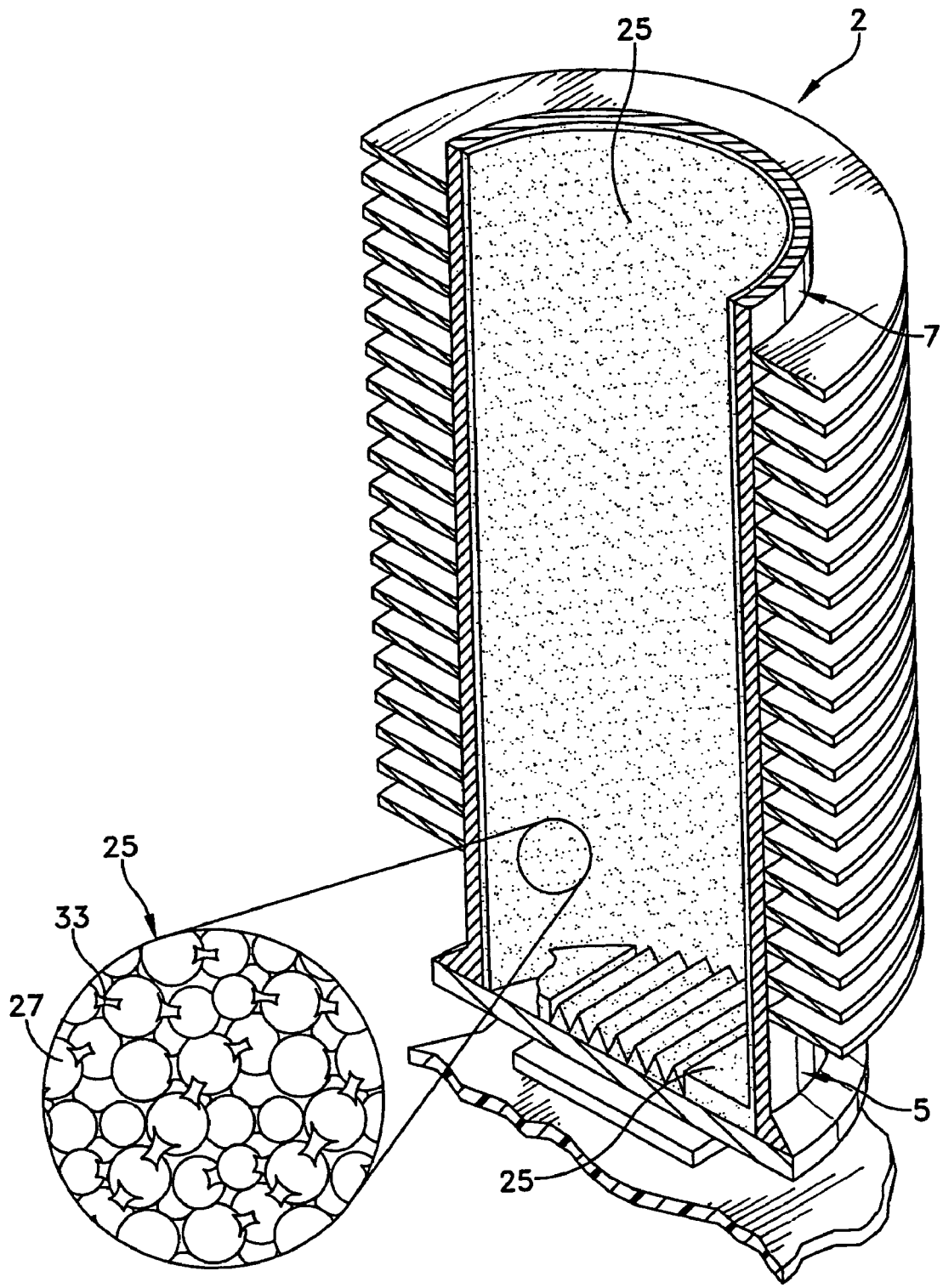
FIG. 14 is an alternative embodiment of tower heat pipe having grooved base wick formed in accordance with the present invention.
FIG. 15 is a highly enlarged surface view of a brazed wick formed in accordance with the present invention.
Figure 16:
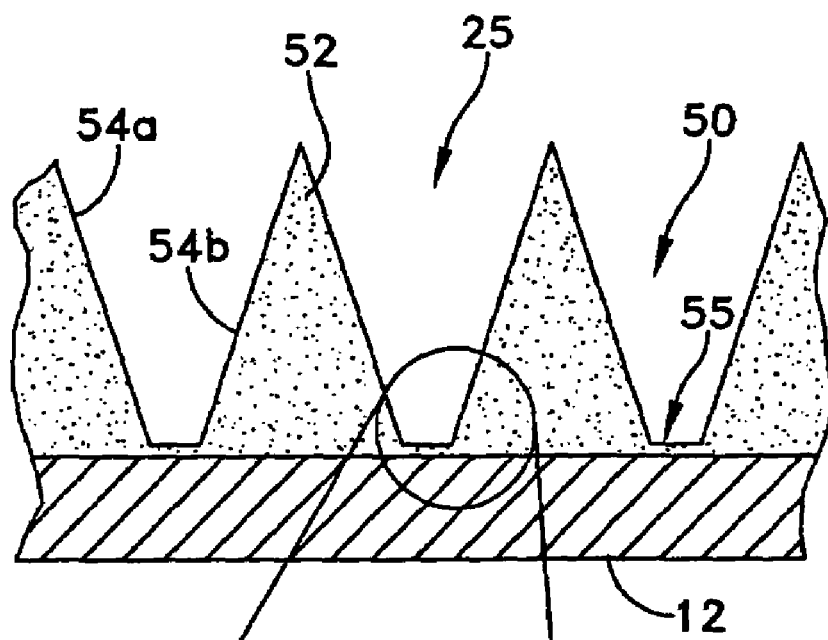
FIG. 16 is a broken-way cross-sectional view of the groove-wick shown in FIGS. 7, 8, and 13.

Referring to FIGS. 1–6, the present invention comprises a wick structure for a heat pipe or heat spreader 2, hereinafter referred to as simply a heat pipe. Such heat pipes 2 are often sized and shaped to transfer and/or spread the thermal energy generated by at least one thermal energy source, e.g., a semiconductor device (not shown), that is thermally engaged between a portion of the heat pipe and a heat sink (not shown). Heat pipes 2 generally comprise a hermetically sealed enclosure such as a flat, hollow plate-like structure (FIG. 2) or a tubular structure (FIGS. 9, 12 and 14). Regardless of outer profile, each enclosure structure defines an evaporator section 5, a condenser section 7, and an internal void space or vapor chamber 10. For example, in a planar rectangular heat pipe 2, vapor chamber 10 is defined between a bottom wall 12 and a top wall 14. In a tubular or tower heat pipe 2, vapor chamber 10 extends longitudinally from one end of the tube to the other (FIGS. 9, 12, and 14).

In one preferred embodiment of a rectilinear enclosure, bottom wall 12 and a top wall 14 comprise substantially uniform thickness sheets of a thermally conductive material, e.g., copper, steel, aluminum, or any of their respective alloys, and are spaced-apart by about 2.0 (mm) to about 4.0 (mm) so as to form vapor chamber 10 within heat pipe 2. Top wall 14 of heat pipe 2 is often substantially planar, and is complementary in shape to bottom wall 12. Bottom wall 12 preferably comprises a substantially planer inner surface 18 and a peripheral edge wall 20. Peripheral edge wall 20 projects outwardly from the peripheral edge of inner surface 18 so as to circumscribe inner surface 18. Vapor chamber 10 is created within heat pipe 2 by the attachment of bottom wall 12 and a top wall 14, along their common edges which are then hermetically sealed at their joining interface 24. A vaporizable fluid (e.g., water, ammonia or freon not shown) resides within vapor chamber 10, and serves as the working fluid for heat pipe 2. For example, heat pipe 2 may be made of copper or copper silicon carbide with water, ammonia, or freon generally chosen as the working fluid. Heat pipe 2 is completed by drawing a partial vacuum within the vapor chamber after injecting the working fluid just prior to final hermetic sealing of the common edges of bottom wall 12 and the top wall 14.

Referring to FIGS. 3–6, in order for heat pipe operation to be initiated within the enclosure of heat pipe 2, a capillary must be present within vapor chamber 10 that will pump condensed liquid from condenser section 7 back to evaporator sections, substantially unaided by gravity. In the present invention, a brazed wick 25 is located on inner surface 18 which defines the boundaries of vapor chamber 10. Brazed wick 25 comprises a plurality of metal particles 27 combined with a filler metal or combination of metals that is often referred to as a "braze" or brazing compound 30. It will be understood that "brazing" is the joining of metals through the use of heat and a filler metal, i.e., brazing compound 30. Brazing compound 30 very often comprises a melting temperature that is above 450° C.–1000° C. but below the melting point of metal particles 27 that are being joined to form brazed wick 25.

In general, to form brazed wick 25 according to the present invention, a plurality of metal particles 27 and brazing compound 30 are heated together to a brazing temperature that melts brazing compound 30, but does not melt plurality of metal particles 27. Significantly, during brazing metal particles 27 are not fused together as with sintering, but instead are joined together by creating a metallurgical bond between brazing compound 30 and the surfaces of adjacent metal particles 27 through the creation of fillets of re-solidified brazing compound (identified by reference numeral 33 in FIGS. 5 and 6). Advantageously, the principle by which brazing compound 30 is drawn through the porous mixture of metal particles 27 to create fillets 33 is "capillary action", i.e., the movement of a liquid within the spaces of a porous material due to the inherent attraction of molecules to each other on a liquid's surface. Thus, as brazing compound 30 liquefies, the molecules of molten brazing metals attract one another as the surface tension between the molten braze and the surfaces of individual metal particles 27 tend to draw the molten braze toward each location where adjacent metal particles 27 are in contact with one another. Fillets 33 are formed at each such location as the molten braze metals re-solidify.

In the present invention, brazing compound 30 and fillets 33 create a higher thermal conductivity wick than, e.g., sintering or fusing techniques. This higher thermal conductivity wick directly improves the thermal conductance of the heat transfer device in which it is formed, e.g., heat pipe, loop heat pipe, etc. Depending upon the regime of heat flux that evaporator 5 is subjected to, the conductance of brazed wick 25 has been found to increase between directly proportional to and the square root of the thermal conductivity increase. Importantly, material components of brazing compound 30 must be selected so as not to introduce chemical incompatibility into the materials system comprising heat pipe 2.

Metal particles 27 may be selected from any of the materials having high thermal conductivity, that are suitable for fabrication into brazed porous structures, e.g., carbon, tungsten, copper, aluminum, magnesium, nickel, gold, silver, aluminum oxide, beryllium oxide, or the like, and may comprise either substantially spherical, oblate or prolate spheroids, ellipsoid, or less preferably, arbitrary or regular polygonal, or filament-shaped particles of varying cross-sectional shape. For example, when metal particles 27 are formed from copper spheres (FIG. 5) or oblate spheroids (FIG. 6) whose melting point is about 1083° C., the overall wick brazing temperature for heat pipe 2 will be about 1000° C. By varying the percentage brazing compound 30 within the mix of metal particles 27 or, by using a more "sluggish" alloy for brazing compound 30, a wide range of heat-conduction characteristics may be provided between metal particles 27 and fillets 33.

For example, in a copper/water heat pipe, any ratio of copper/gold braze could be used, although brazes with more gold are more expensive. A satisfactory combination for brazing compound 30 has been found to be about six percent (6)% by weight of a finely divided (−325 mesh), 65%/35% copper/gold brazing compound, that has been well mixed with the copper powder (metal particles 27). More or less braze is also possible, although too little braze reduces the thermal conductivity of brazed wick 25, while too much braze will start to fill the wick pores with solidified braze metal. One optimal range has been found to be between about 2% and about 10% braze compound, depending upon the braze recipe used. When employing copper powder as metal particles 27, a preferred shape of particle is spherical or spheroidal. Metal particles 27 should often be coarser than about 200 mesh, but finer than about 20 mesh. Finer wick powder particles often require use of a finer braze powder particle. The braze powder of brazing compound 30 should often be several times smaller in size than metal particles 27 so as to create a uniformly brazed wick 25 with uniform properties.

Other brazes can also be used for brazing copper wicks, including nickelnickel-based Nicrobrazes, silver/copper brazes, tin/silver, lead/tin, and even polymers. The invention is also not limited to copper/water heat pipes. For example, aluminum and magnesium porous brazed wicks can be produced by using a braze that is an aluminum/magnesium intermetallic alloy.

Brazing compound 30 should often be well distributed over each metal particle surface. This distribution of brazing compound 30 may be accomplished by mixing brazing compound 30 with an organic liquid binder, e.g., ethyl cellulose, that creates an adhesive quality on the surface of each metal particle 27 (i.e., the surface of each sphere or spheroid of metal) for brazing compound 30 to adhere to. In one embodiment of the invention, one and two tenths grams by weight of copper powder (metal particles 27) is mixed with two drops from an eye dropper of an organic liquid binder, e.g., ISOBUTYL METHACRYLATE LACQUER to create an adhesive quality on the surface of each metal particle 27 (i.e., the surface of each sphere or spheroid of metal) for braze compound 30 to adhere to. A finely divided (e.g., −325 mesh) of braze compound 30 is mixed into the liquid binder coated copper powder particles 27 and allowed to thoroughly air dry. About 0.072 grams, about 6% by weight of copper/gold in a ratio of 65%/35% copper/gold brazing compound, has been found to provide adequate results. The foregoing mixture of metal particles 27 and brazing compound 30 are applied to the internal surfaces of a heat pipe 2, for example inner surface 18 of bottom wall 12, and heated evenly so that brazing compound 30 is melted by heating metal particles 27. Molten brazing compound 30 that is drawn by capillary action, forms fillets 33 as it solidifies within the mixture of metal particles 27. For example, vacuum brazing or hydrogen brazing at about 1020° C. for between two and eight minutes, and preferably about five minutes, has been found to provide adequate fillet formation within a brazed wick. A vacuum of at least $10^{-5}$ torr or lower has been found to be sufficient, and if hydrogen furnaces are to be used, the hydrogen furnace should use wet hydrogen. In one embodiment, the assembly is vacuum fired at 1020° C. for 5 minutes, in a vacuum of is $5 \times 10^{-5}$ torr or lower.

Figure 17:
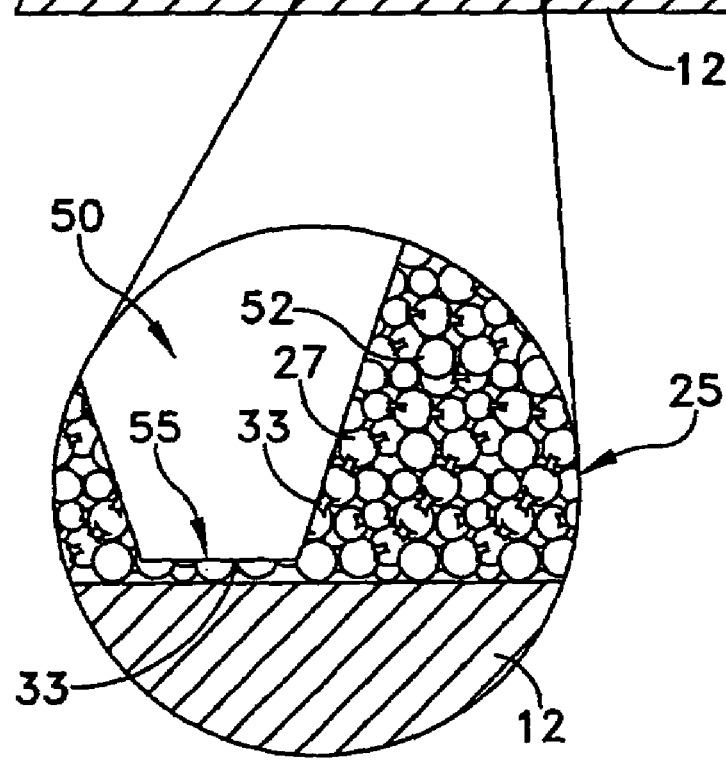
FIG. 17 is a highly enlarged cross-sectional view of a portion of the groove brazed wick shown in FIGS. 7, 8, 13, and 15.
Figure 18:
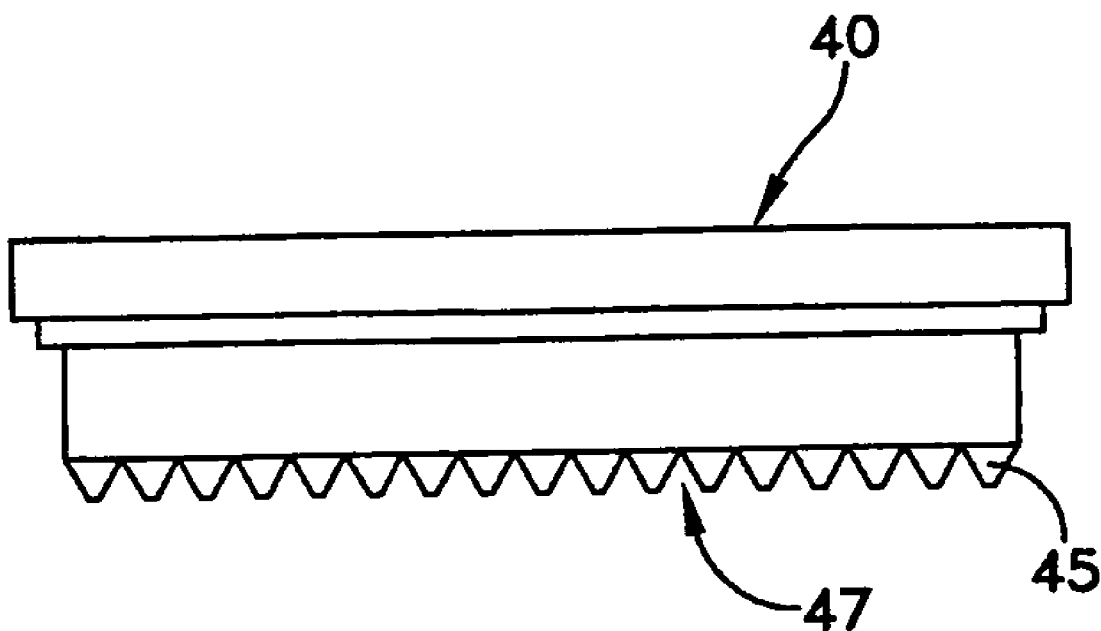
FIG. 18 is an end view of a mandrel used in manufacturing a grooved brazed wick in accordance with the present invention.

Referring to FIGS. 7, 8, 14, and 16–17, grooved brazed wick structure 38 may also be advantageously formed from metal particles 27 combined with brazing compound 30. More particularly, a mandrel 40 (FIG. 18) is used to create grooved wick structure 38 that comprises a plurality of parallel lands 45 that are spaced apart by parallel grooves 47. Lands 45 of mandrel 40 form grooves 50 of finished brazed grooved wick structure 38, and grooves 47 of mandrel 40 form lands 52 finished brazed grooved wick structure 38. Each land 52 is formed as an inverted, substantially "V"-shaped or pyramidal protrusion having sloped side walls 54a, 54b, and is spaced-apart from adjacent lands. Grooves 50 separate lands 52 and are arranged in substantially parallel, longitudinally (or transversely) oriented rows that extend at least through evaporator section 5. The terminal portions of grooves 50, adjacent to, e.g., a peripheral edge wall 20, may be unbounded by further porous structures. In one embodiment, a relatively thin layer of brazed metal particles is deposited upon inner surface 18 of bottom wall 12 so as to form a groove-wick 55 at the bottom of each groove 50 and between spaced-apart lands 52. For example, brazed copper powder particles 27 are deposited between lands 52 such that groove-wick 55 comprises an average thickness of about one to six average copper particle diameters (approximately 0.005 millimeters to 0.5 millimeters, preferably, in the range from about 0.05 millimeters to about 0.25 millimeters) when deposited over substantially all of inner surface 18 of bottom wall 12, and between sloped side walls 54a, 54b of lands 52. Advantageously, metal particles 27 in groove-wick 55 are thermally and mechanically engaged with one another by a plurality of fillets 33 (FIG. 17). When forming grooved brazed wick structure 38, inner surface 18 of bottom wall 12 (often a copper surface) is lightly coated with organic binder ISOBUTYL METHACRYLATE LACQUER and the surface is "sprinkle coated" with braze compound copper/gold in a ratio of 65%/35%, with the excess shaken off. Between 1.250 and 1.300 grams (often about 1.272 grams) of braze coated copper powder 27 is then placed on the braze coated copper surface and mandrel 40 is placed on top to form a grooved brazed wick structure 38.

Significantly groove-wick 55 is formed so as to be thin enough that the conduction delta-T is small enough to prevent boiling from initiating at the interface between inner surface 18 of bottom wall 12 and the brazed powder forming the wick. The formation of fillets 33 further enhances the thermal conductance of groove-wick 55. Groove-wick 55 is an extremely thin wick structure that is fed liquid by spaced lands 52 which provide the required cross-sectional area to maintain effective working fluid flow. In cross-section, groove-wick 55 comprises an optimum design when it comprises the largest possible (limited by capillary limitations) flat area between lands 52. This area should have a thickness of, e.g., only one to six copper powder particles. The thinner groove-wick 55 is, the better performance within realistic fabrication constraints, as long as the surface area of inner surface 18 has at least one layer of copper particles that are thermally and mechanically joined together by a plurality of fillets 33. This thin wick area takes advantage of the enhanced evaporative surface area of the groove-wick layer, by limiting the thickness of groove-wick 55 to no more than a few powder particles while at the same time having a significantly increased thermal conductance due to the presence of fillets 33 joining metal particle 27. This structure has been found to circumvent the thermal conduction limitations associated with the prior art.

It is to be understood that the present invention is by no means limited only to the particular constructions herein disclosed and shown in the drawings, but also comprises any modifications or equivalents within the scope of the claims.

What is claimed is:

1. A heat pipe comprising:
   a sealed and partially evacuated enclosure having an internal surface;
   a grooved brazed wick disposed upon said internal surface comprising a plurality of individual particles which together yield an average particle diameter and a brazing compound comprising about sixty-five percent weight copper and thirty-five percent weight gold such that said fillets of said brazing compound are formed between adjacent ones of said plurality of particles so as to create a network of capillary passageways between said particles, and further including at least two lands that are in fluid communication with one another through a particle layer disposed between said at least two lands wherein said particle layer comprises at least one dimension that is no more than about six average particle diameters wherein said particles in said particle layer are thermally engaged with one another by a plurality of said fillets; and
   a working fluid disposed within said enclosure.

2. A heat pipe according to claim 1 wherein said plurality of individual particles are selected from the group consisting of carbon, tungsten, copper, aluminum, magnesium, nickel, gold, silver, aluminum oxide, and beryllium oxide.

3. A heat pipe according to claim 1 wherein said plurality of individual particles comprise a shape selected from the group consisting of spherical, oblate spheroid, prolate spheroid, polygonal, and filament.

4. A heat pipe according to claim 1 wherein said plurality of individual particles comprise at least one of copper spheres and oblate copper spheroids having a melting point of about 1083° C.

5. A heat pipe according to claim 1 wherein said brazing compound is present in the range from about two percent to about ten percent by weight.

6. A heat pipe according to claim 1 wherein said plurality of individual particles comprise copper powder comprising particles sized in a range from about twenty mesh to about two-hundred mesh.

7. A heat pipe comprising:
a sealed and partially evacuated enclosure having an internal surface;
a grooved brazed wick disposed upon said internal surface comprising a plurality of individual particles which together yield an average particle diameter and a brazing compound comprising about sixty-five percent weight copper and thirty-five percent weight gold and further wherein said brazing compound comprises six percent by weight of a finely divided copper/gold such that fillets of said brazing compound are formed between adjacent ones of said plurality of individual particles so as to create a network of capillary passageways between said individual particles, and further including at least two lands that are in fluid communication with one another through a particle layer disposed between said at least two lands wherein said particle layer comprises at least one dimension that is no more than about six average particle diameters wherein said particles in said particle layer are thermally engaged with one another by a plurality of said fillets; and
a working fluid disposed within said enclosure.

8. A heat pipe comprising:
a sealed and partially evacuated tubular enclosure having an internal surface covered by a brazed wick comprising a plurality of particles joined together by a brazing compound comprising about sixty-five percent weight copper and thirty-five percent weight gold such that fillets of said brazing compound are formed between adjacent ones of said plurality of particles so as to form a network of capillary passageways between said particle and sealed at a first end;
a base sealingly fixed to a second end of said enclosure so as to form an internal surface within said enclosure;
a working fluid disposed within said enclosure;
at least one fin projecting radially outwardly from an outer surface of said tubular enclosure; and
a grooved brazed wick disposed upon said internal surface comprising a plurality of individual particles which together yield an average particle diameter and said brazing compound such that fillets of said brazing compound are formed between adjacent ones of said plurality of particles, and further including at least two lands that are in fluid communication with one another through a particle layer disposed between said at least two lands wherein said particle layer comprises at least one dimension that is no more than about six average particle diameters wherein said particles in said particle layer are thermally engaged with one another by a plurality of said fillets.

* * * * *